US007227781B2

(12) United States Patent
Iizuka (10) Patent No.: US 7,227,781 B2
(45) Date of Patent: Jun. 5, 2007

(54) SEMICONDUCTOR DEVICE PROVIDED WITH NAND STRINGS AND SELECT GATES HAVING DIFFERENT GATE LENGTHS

(75) Inventor: Hirohisa Iizuka, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 11/190,005

(22) Filed: Jul. 27, 2005

(65) Prior Publication Data
US 2006/0023505 A1    Feb. 2, 2006

(30) Foreign Application Priority Data
Jul. 27, 2004    (JP) ............................. 2004-218738

(51) Int. Cl.
*G11C 11/34* (2006.01)
(52) U.S. Cl. ............. 365/185.17; 257/775; 365/185.23
(58) Field of Classification Search ........... 365/185.17, 365/185.24, 185.23; 257/213, 214, 314, 257/315, 316, 319, 329, 330, 331, 332, E29.135, 257/E21.624, E21.638, 775
See application file for complete search history.

(56) References Cited

U.S. PATENT DOCUMENTS 4,962,481 A * 10/1990 Choi et al. ............. 365/185.17
4,980,861 A * 12/1990 Herdt et al. ............ 365/185.17
5,528,537 A * 6/1996 Lee et al. ............... 365/185.11
5,698,879 A * 12/1997 Aritome et al. ............. 257/315
5,943,262 A * 8/1999 Choi ..................... 365/185.17
6,028,788 A * 2/2000 Choi et al. ............. 365/185.11
6,151,249 A   11/2000 Shirota et al.
6,703,670 B1 * 3/2004 Lines ......................... 257/392
2002/0195668 A1* 12/2002 Endoh et al. ................ 257/390

FOREIGN PATENT DOCUMENTS

JP         6-275800       9/1994
JP         6-325581       11/1994

* cited by examiner

*Primary Examiner*—Richard T. Elms
*Assistant Examiner*—Alexander Sofocleous
(74) *Attorney, Agent, or Firm*—Oblon, Spivak, McClelland, Maier & Neustadt, P.C.

(57) ABSTRACT

A non-volatile semiconductor memory device includes a plurality of bit lines, a bit line contact corresponding to the bit lines, a first NAND string and a second NAND string, a first string selective transistor and a second string selective transistor, and a third string selective transistor and a fourth string selective transistor. The first and third string selective transistors are connected to each other, whereas the second and fourth string selective transistors are connected to each other. Each of the first and fourth string selective transistors has a first gate length and each of the second and third string selective transistors has a second gate length differing from the first gate length.

6 Claims, 7 Drawing Sheets

SEMICONDUCTOR DEVICE PROVIDED WITH NAND STRINGS AND SELECT GATES HAVING DIFFERENT GATE LENGTHS

CROSS-REFERENCE TO RELATED APPLICATIONS

This application is based upon and claims the benefit of priority from the prior Japanese Patent Application No. 2004-218738, filed on Jul. 27, 2004, the entire contents of which are incorporated herein by reference.

BACKGROUND OF THE INVENTION

1. Field of the Invention

The present invention relates to a non-volatile semiconductor memory device configured so that a plurality of NAND strings are connected to each bit line.

2. Description of the Related Art

Figure 6:
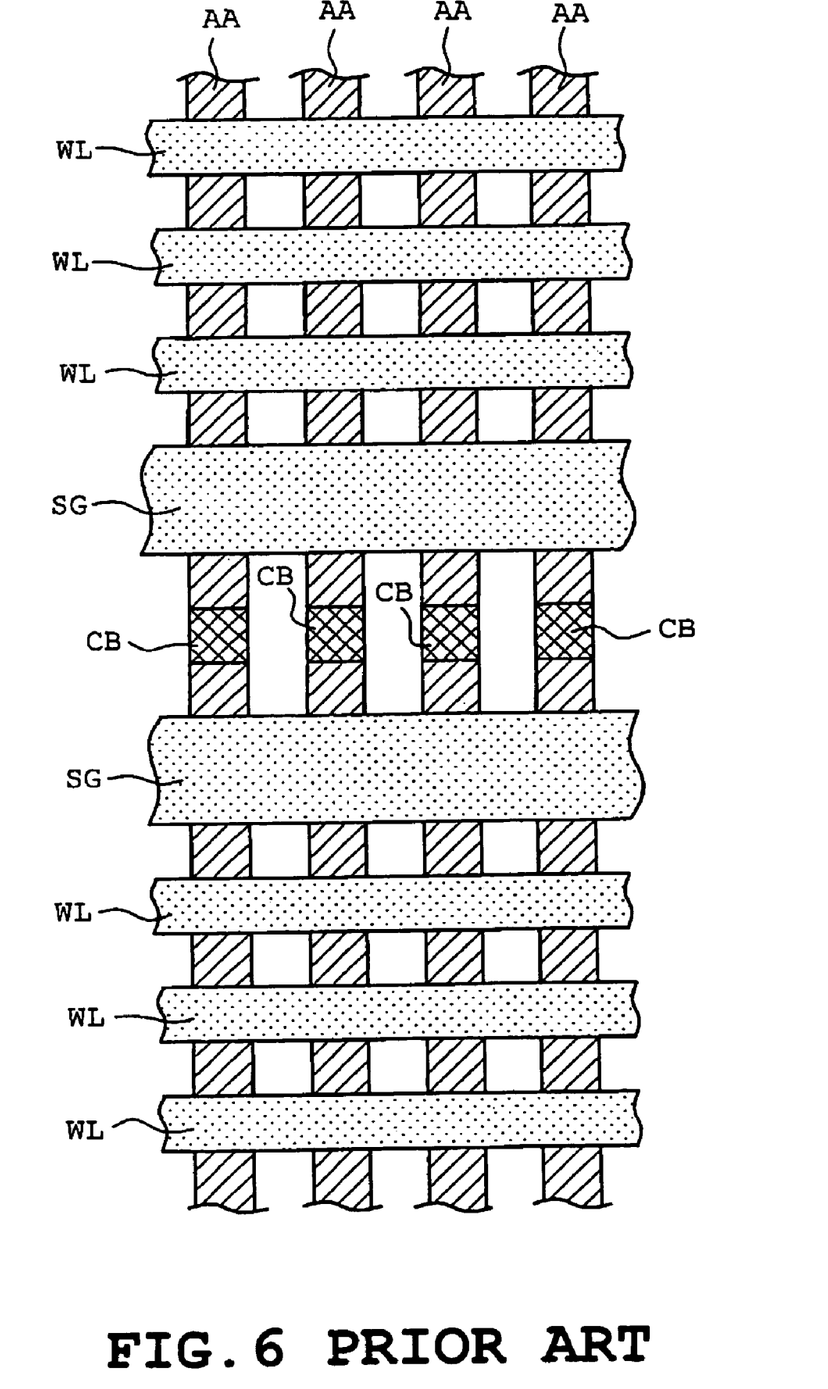
FIG. 6 is a view similar to FIG. 1, showing a conventional arrangement.

For example, NAND non-volatile memory devices have conventionally been formed with one active area AA (element isolation region) for each one bit line as shown in FIG. 6, and one row of NAND strings are controlled by the active area AA. In FIG. 6, reference symbol "SG" designates a selective gate, "WL" a word line, "CB" a forming region of a bit line contact. The active area AA includes a source/drain diffusion layer of a MOS transistor and a channel region.

With progress in high integration and refinement of a memory cell, an element isolation region has recently been narrowed and it has become difficult to ensure a forming region of a bit line contact CB. JP-A-H06-325581 discloses an arrangement of non-volatile semiconductor memory device to overcome the above-noted technical problem. According to the disclosed arrangement, two rows of NAND strings are formed so as to correspond to one bit line contact. Consequently, a forming region of a bit line contact which can be ensured corresponds to a total width of two rows of NAND strings, whereupon the bit line contact can readily be formed even when a conventional process is applied.

In a NAND non-volatile semiconductor memory device with two rows of NAND strings provided so as to correspond to one bit line, two selective gate transistors are provided for each NAND string. When each selective gate transistor is configured so that a threshold voltage differs between rows and columns, either one or any one of the NAND strings can be selected. In order that the NAND non-volatile semiconductor memory device may be arranged into such a configuration, when impurities are implanted during the forming of a selective gate transistor, dose is adjusted and ion implantation is then carried out, whereby a threshold voltage of the MOS transistor differs between rows and columns of NAND strings.

Figure 7:
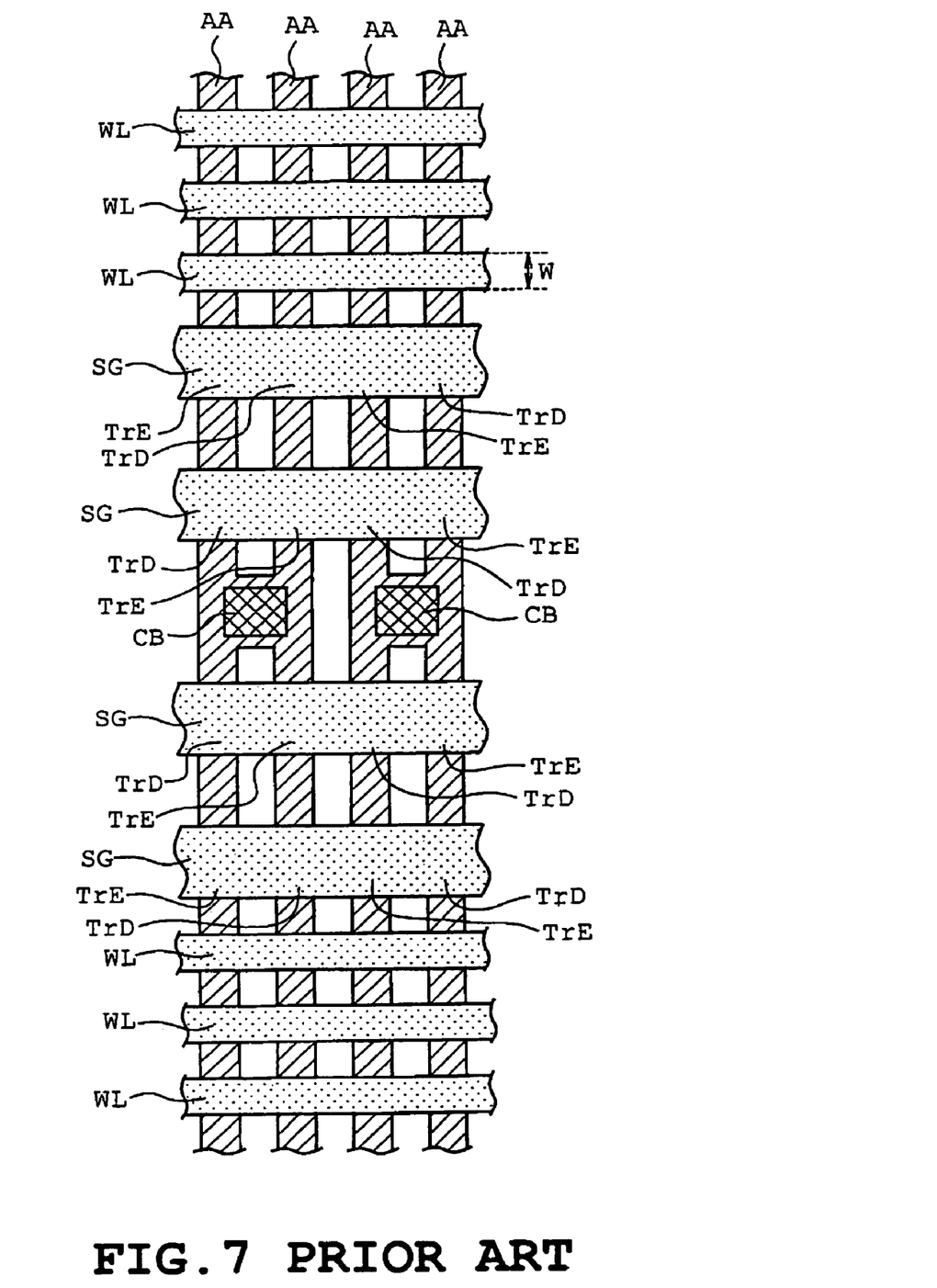
FIG. 7 is also a view similar to FIG. 1, showing another conventional arrangement.

FIG. 7 shows an example of the above-described arrangement. A selective gate transistor as shown in FIG. 7 includes enhancement mode MOS transistors TrE and depletion mode MOS transistors TrD both of which are formed alternately. Reference symbol "W" in FIG. 7 designates a width of the word line WL, namely, a gate length of each MOS transistor. Each of the MOS transistors TrE and TrD can be formed by adjusting an amount of ion implantation of impurities (dose).

Conventionally, in a NAND non-volatile semiconductor memory device with two rows of NAND strings provided so as to correspond to one bit line, when impurities are ion-implanted in the forming of each selective gate transistor, dose is adjusted and ion implantation is then carried out, whereby a threshold voltage of the MOS transistor differs between rows and columns of NAND strings. However, when the design rule is rendered more strict, adjusting dose and then carrying out ion implantation becomes difficult due to misalignment of a mask. Moreover, since dopant is unnecessarily diffused during a thermal process, there is a possibility that memory cells and selective gate transistors in the vicinity of the diffused layer would adversely be affected.

BRIEF SUMMARY OF THE INVENTION

Therefore, an object of the present invention is to provide a non-volatile semiconductor memory device in which the bit line contact can be formed in a process similar to the conventional process and furthermore, adjusting dose and then carrying out ion implantation is unnecessary.

The present invention provides a non-volatile semiconductor memory device comprising a plurality of bit lines, a bit line contact provided so as to correspond to the bit lines, a first NAND string and a second NAND string both connected to a common bit line via the bit line contact, a first string selective transistor and a second string selective transistor both connected in series to the first NAND string between the first NAND string and the bit line contact, and a third string selective transistor and a fourth string selective transistor both connected in series to the second NAND string between the second NAND string and the bit line contact, wherein the first and third string selective transistors are connected to each other, whereas the second and fourth string selective transistors are connected to each other, and each of the first and fourth string selective transistors has a first gate length and each of the second and third string selective transistors has a second gate length differing from the first gate length.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

An embodiment of the present invention will be described with reference to FIGS. 1 to 3. The invention is applied to a NAND flash memory in the embodiment.

Figure 2:
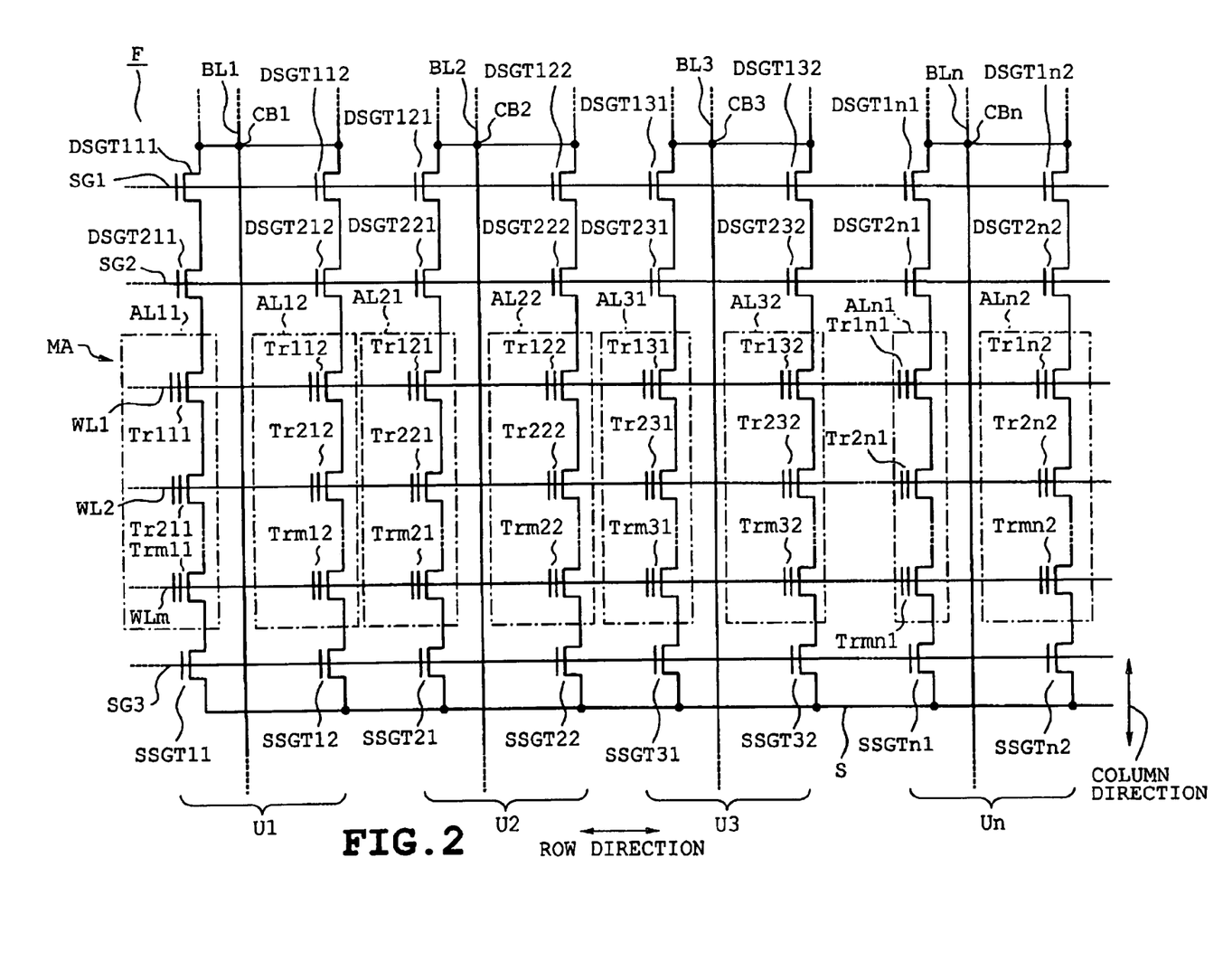
FIG. 2 shows a schematic electrical arrangement of the memory cell region of the non-volatile semiconductor memory device.

FIG. 2 schematically shows an electrical circuit arrangement of a memory cell region of a NAND flash memory device F of the embodiment. The NAND flash memory device F includes a plurality of bit lines BL1 to BLn. A plurality of or two NAND strings AL11 and AL12 are connected to the bit line BL1. Each NAND string comprises a plurality of memory cells series connected into a NAND structure. The NAND string will hereinafter be abbreviated to "string." A plurality of columns of the strings AL11 and AL12 are arranged in parallel to the bit line BL1, whereby a memory cell array MA is configured. Thus, in the memory cell array MA, strings AL11 and AL12 to ALn1 and ALn2 are formed so as to correspond to the bit lines BL1 to BLn respectively. The strings AL11 and AL12 to ALn1 and ALn2 have the same configuration. More specifically, each string comprises a plurality of series-connected memory cell transistors Tr1 to Trm the number of which is shown by "m" and as two squared by "k", for example, 8, 16 or 32. In FIG. 2, subscripts "11" to "n2" are affixed to the memory cell transistors Tr1 to Trm so as to correspond to the NAND strings AL11 to ALn2 respectively. The memory cell transistors Tr1 to Trm are arranged in a row direction and have gate terminals connected to word lines WL1 to WLm respectively.

The bit lines BL1 to BLn are provided with basic units U1 to Un including the strings AL11 and AL12 to ALn1 and ALn2 respectively. The following will describe the basic unit U2 including strings AL21 and AL22 corresponding to a bit line BL2. Two string selective transistors or selective gate transistors DSGT121 and DSGT221 are series-connected between a bit line contact CB2 of the bit line BL2 and a memory cell transistor Tr121 provided at one end of the string AL21. Two string selective transistors or selective gate transistors DSGT122 and DSGT222 are series-connected between the memory cell transistor Tr122 provided at one end of the string AL22 and the bit line contact CB2 of the bit line BL2. Each of the selective gate transistors DSGT121 and DSGT222 comprises a depletion mode MOS transistor, whereas each of the selective gate transistors DSGT221 and DSGT122 comprises an enhancement mode MOS transistor.

A source selective gate transistor SSGT21 is provided between a memory cell transistor Trm21 provided at the other end of the string AL21 and a source line S. The source line S is set at a ground potential.

Figure 1:
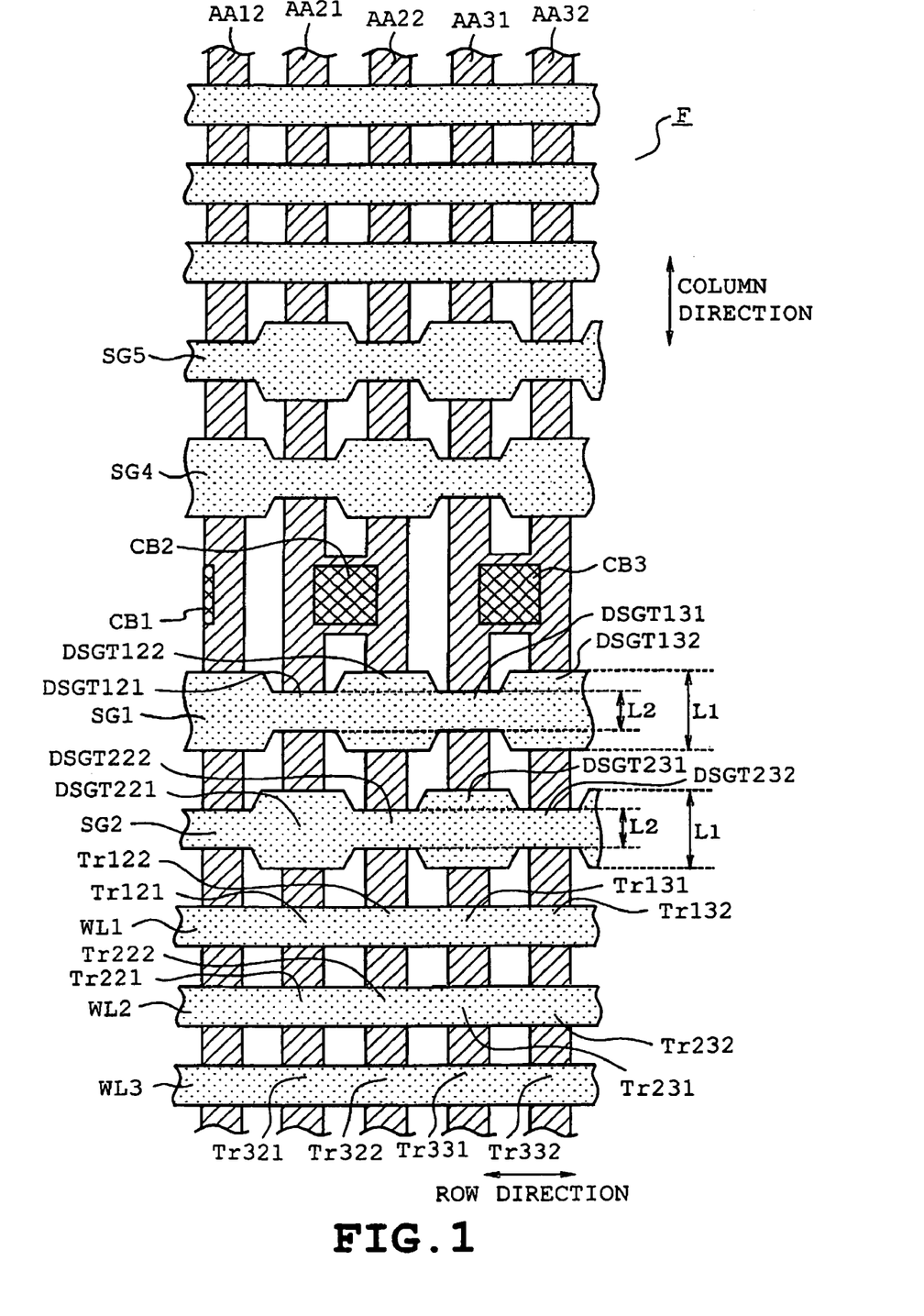
FIG. 1 is a typical plan view of a memory cell region of a flash memory in accordance with the present invention.

The following will describe the configurations of the selective gate transistors and memory cell transistors in the flash memory device F and regions occupied by the bit line contacts CB1 to CBn with reference to FIGS. 1 and 2. Each of the memory cell transistors Tr121 to Trm21 constituting the string AL21 has a source-drain diffusion layer (source-drain region) and a channel region both formed in an active area AA21. Furthermore, each of the memory cell transistors Tr122 to Trm22 constituting the string AL22 has a source-drain diffusion layer (source-drain region) and a channel region both formed in an active area AA22. Furthermore, the selective gate transistors DSGT121 and DSGT221 have respective source-drain diffusion layers and channel regions formed in the active area AA21. The selective gate transistors DSGT122 and DSGT222 have respective source-drain diffusion layers and channel regions formed in the active area AA22. The source transistors SSGT21 and SSGT22 also have source-drain diffusion layers and channel regions formed in the active areas AL21 and AL22 respectively.

The transistor DSGT121 has a drain diffusion layer connected structurally and electrically conductively to the bit line contact CB2, whereas the transistor DSGT122 has a drain diffusion layer connected structurally and electrically conductively to the bit line contact CB2. A bit line selective voltage is applied between the bit line BL2 and the source line S via the bit line contact CB2. In this case, two columns of the active areas AA21 and AA22 corresponding to the widths of two columns of strings AL21 and AL22 are ensured in the row direction as a forming region of the bit line contact CB2. The above-described configuration can ensure a wider forming region of bit line contact as compared with the conventional configuration in which only a forming region of the bit line contact CB corresponding to one column of active area AA as shown in FIG. 6.

Figure 3:
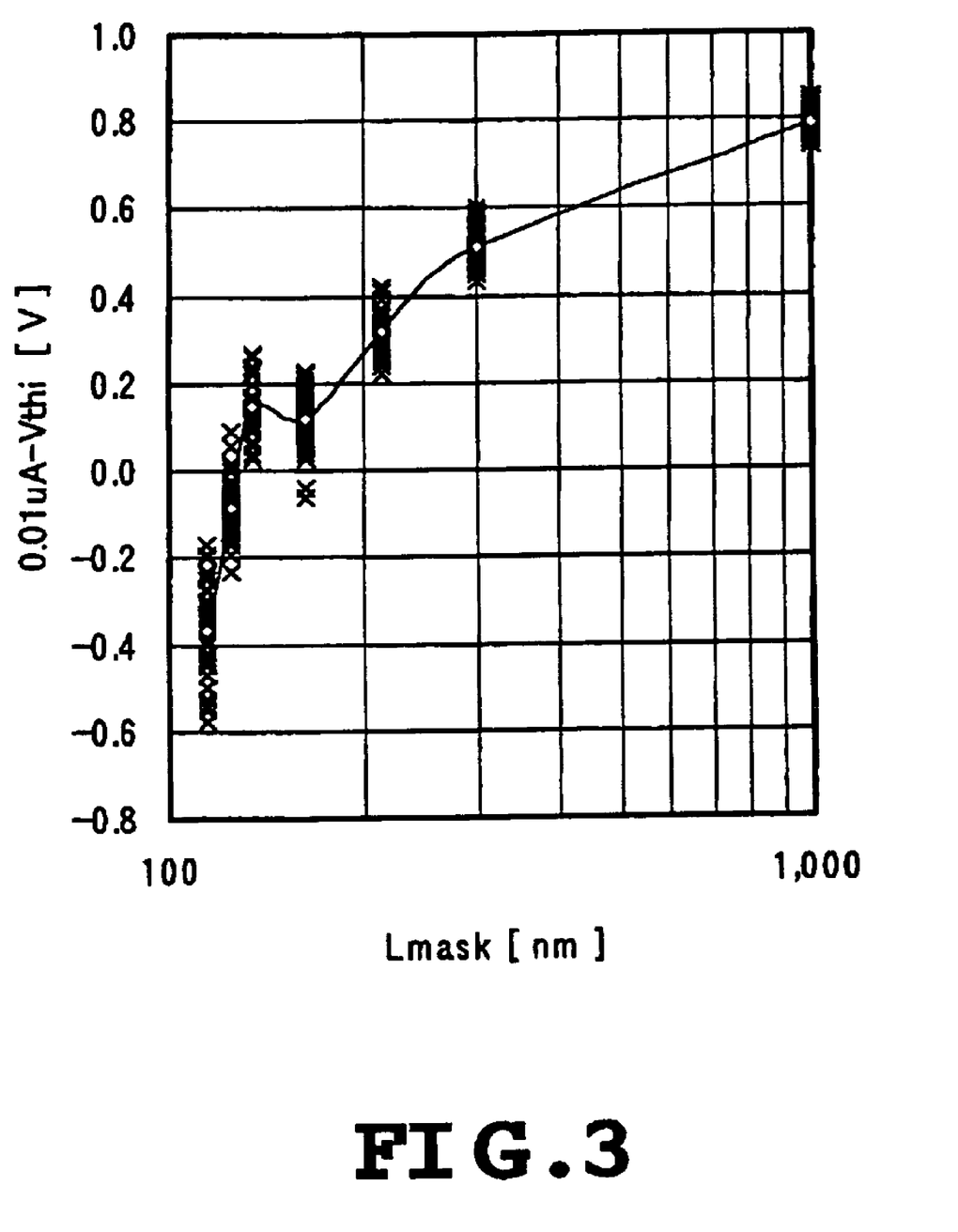
FIG. 3 is a graph showing the gate length dependency of threshold voltage.

FIG. 3 shows the gate length dependency of threshold voltage of the MOS transistor. In MOS transistors, a threshold voltage can be adjusted utilizing a short channel effect by adjustment of a gate length. Then, when a MOS transistor is formed so that the gate length L1 (Lmask) becomes, for example, about 220 nm, as shown in FIG. 3, the threshold voltage Vt of the MOS transistor can be adjusted so as to be ranged from +0.2 to +0.4 V, whereupon an enhancement mode transistor can be configured. Furthermore, when a MOS transistor is formed so that the gate length L2 becomes, for example, about 120 nm, which value is smaller than the gate length L1, the threshold value Vt of the MOS transistor can be adjusted so as to range from about −0.6 to −0.2 V, whereupon a depletion mode transistor can be configured.

The gate length L2 can be set at 120 nm, for example, in order that each of the selective gate transistors DSGT121 and DSGT222 may be configured into a depletion mode transistor. Furthermore, in order that each of the selective gate transistors DSGT221 and DSGT122 may be formed into an enhancement mode transistor, the gate length L1 of the transistor can be 220 nm, for example, so that the gate length L1 is larger than gate lengths of the selective gate transistors DSGT121 and DSGT222. Consequently, transistors having different threshold voltages Vt respectively can be configured.

In FIG. 1, the selective gates SG4, SG5 and the like and the word lines WL1 to WL3 and the like are formed so as to be linearly symmetrical with respect to a direction in which the bit line contacts CB1 to CBn are arranged. The description of this configuration will be eliminated since the configuration is similar to the configuration of the selective gates SG1, SG2 and the like and word lines WL1 to WL3 and the like.

Returning to FIG. 2, row decoders and column decoders neither shown are connected to the word lines WL1 to WLm and bit lines BL1 to BLn respectively. Furthermore, a control circuit not shown supplies selective signals to gates of the drain selective gate transistors DSGT111 and DSGT112, DSGT 211 and DSGT212, selective gate transistors DSGTT1n1 and SSGTn2, DSGT2n1 and DSGT2n2, source selective gate transistors SSGT11 and SSGT12 and selective gate transistors SSGTn1 and SSGTn2, whereby the strings AL11 and AL12 to ALn1 and ALn2 are switchable between enable and disenable states.

The operation of the foregoing configuration will now be described. The following describes a case where the bit line BL2 has been selected. Upon selection of the bit line BL2, the control circuit not shown supplies a H level voltage to the selective gate SG1 and further supplies a L level voltage (0 V, for example) to the selective gate SG2. Furthermore, when the an H level voltage is applied to the source selective gate SG3, the selective gate transistors DSGT121, DSGT122, DSGT222, SSGT21 and SSGT22 are turned on, whereas the transistor DSGT221 is turned off. In this case, the string AL22 is enabled and the string AL21 is disenabled. At this time, a predetermined voltage is applied to the word lines WL1 to WLm so that one of the memory cells is selected by each of the transistors Tr122 to TRm22, whereupon read/write and erasure of each memory cell constituting the array AL22 can be performed.

On the other hand, the control circuit supplies a L level reference voltage (0 V, for example) to the gate of each of the selective gate transistors DSGT121 and DSGT122, whereas the control circuit supplies an H level voltage to the gate of each of the selective gate transistors DSGT221 and DSGT222. Furthermore, the control circuit supplies an H level voltage to the gate of each of the source selective gate transistors SSGT21 and SSGT22. Then, the transistors DSGT121, DSGT221, DSGT222, SSGT21 and SSGT22 are turned on, whereas the transistor DSGT122 is turned off. In this case, the string AL21 is enabled and the string AL22 is disenabled. At this time, when the predetermined voltage is applied to each of the word lines WL1 to WLm as described above, one of the memory cells is selected by each of the transistors Tr122 to TRm22, whereupon read/write and erasure of each memory cell constituting the array AL21 can be performed. The same operation is achieved when one of the bit lines BL1, BL3 to BLn is selected. Accordingly, the description will be eliminated.

According to the foregoing embodiment, two columns of NAND strings AL21 and AL22 are configured so as to correspond to the bit line contact CB2. The selective gate transistors DSGT121 and DSGT221 are series-connected between the bit line contact CB2 of the bit line BL2 and a memory cell transistor Tr121 provided at one end of the string AL21 in the row direction. The selective gate transistors DSGT122 and DSGT222 are series-connected between the memory cell transistor Tr122 provided at one end of the string AL22 and the bit line contact CB2 of the bit line BL2 in the row direction. The four selective gate transistors are formed so that the gate lengths of the transistors differ from one another both in the column direction and in the row direction. Accordingly, even when the design rule is rendered strict, a width of two columns of the strings AL21 and AL22 can be ensured as the region of the bit line contact CB2. As a result, the bit line contact CB2 can readily be formed and the threshold voltage can be varied utilizing the short channel effect of each transistor. Consequently, adjusting dose of impurities and then carrying out an ion implantation is unnecessary when the selective gate transistors DSGT121, DSGT221, DSGT122 and DSGT222 are formed.

Figure 4:
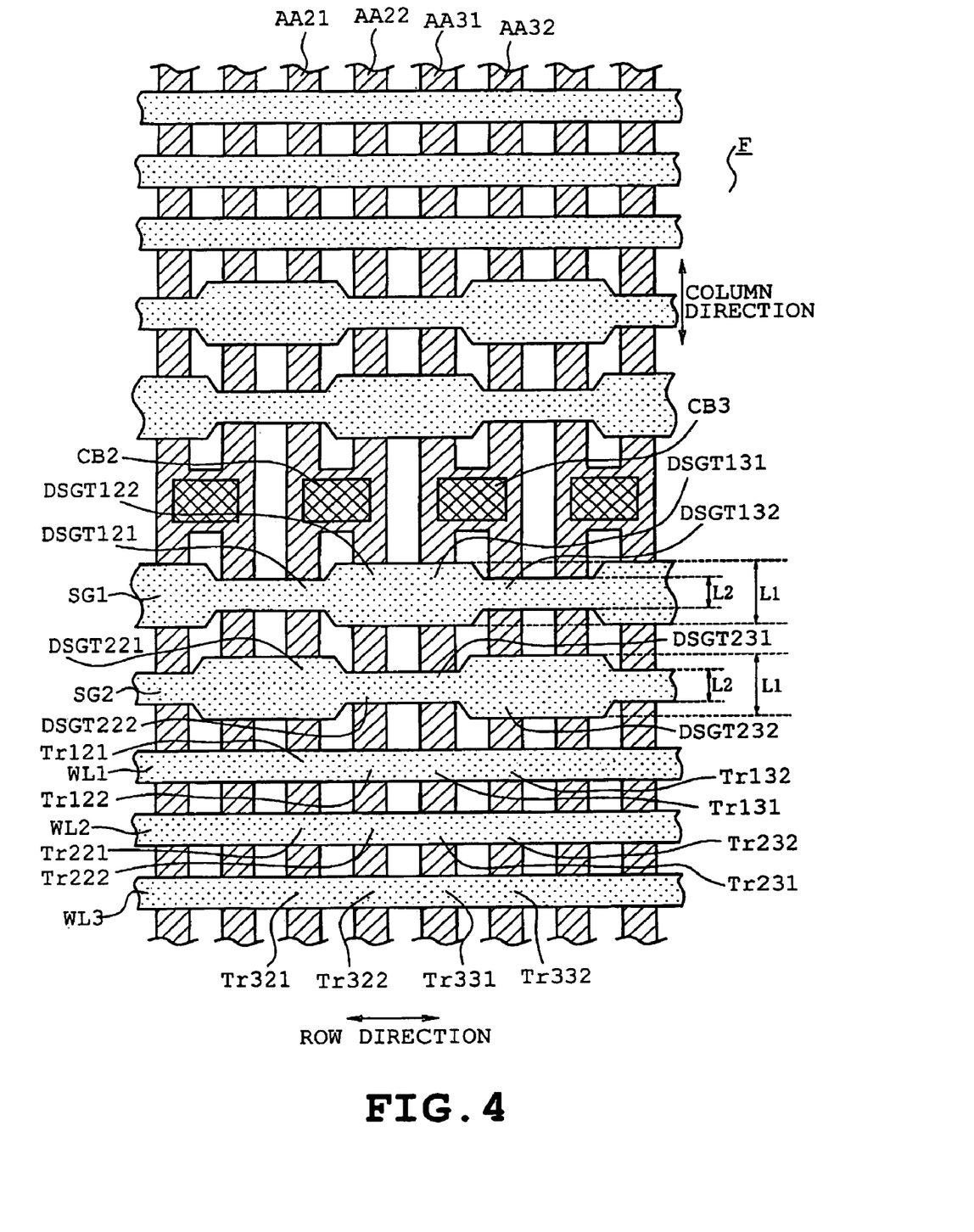
FIG. 4 is a view similar to FIG. 1, showing a second embodiment of the invention.

FIG. 4 illustrates a second embodiment of the invention. The second embodiment differs from the previous embodiment in the relationship in an arrangement of selective gate transistors in the bit lines BL2 and BL3. In the second embodiment, identical or similar parts are labeled by the same reference symbols as those in the first embodiment and the description of these parts will be eliminated. Only the difference of the second embodiment from the first embodiment will be described. In the following description, the bit line BL2 serves as a bit line in the present invention and the bit line BL3 serves as a second bit line.

The bit line BL3 is formed so as to be adjacent to the bit line BL2 as shown in FIG. 2. Selective gate transistors DSGT131, DSGT231, DSGT132 and DSGT232 are provided so as to correspond to the bit line BL3. The selective gate transistors DSGT131 and DSGT231 are series-connected between the bit line contact CB3 of the bit line BL3 and a string AL31. Furthermore, the selective gate transistors DSGT132 and DSGT232 are series-connected between the bit line contact CB3 of the bit line BL3 and a string AL32.

The selective gate transistor DSGT131 is formed so as to be adjacent to the selective gate transistor DSGT122 in the row direction. Similarly, the transistor DSGT231 is formed so as to be adjacent to the selective gate transistor DSGT222 in the row direction. FIG. 4 schematically illustrates a gate structure of the selective gate transistor and an array structure of the memory cell transistors in this case. As shown, the adjacent selective gate transistors DSGT122 and DSGT131 are formed into the enhancement mode transistors having the same gate length (length L1). Furthermore, the adjacent selective gate transistors DSGT222 and DSGT231 are formed into the depletion mode transistors having the same gate length (length L2). Since the adjacent selective gate transistors DSGT122 and DSGT131 have the same gate length, the selective gate transistors DSGT122 and DSGT131 can be formed using the active area corresponding to two columns. Consequently, the gates of the transistors can be formed easily in the process. Since the adjacent selective gate transistors DSGT222 and DSGT231 also have the same gate length, the gates of the transistors can be formed easily in the process.

According to the second embodiment, the gates of the adjacent selective gate transistors DSGT122 and DSGT131 and the adjacent selective gate transistors DSGT222 and DSGT231 are formed so as to have the same gate length in the same process, the gates can be formed more easily as compared with the first embodiment.

Figure 5:
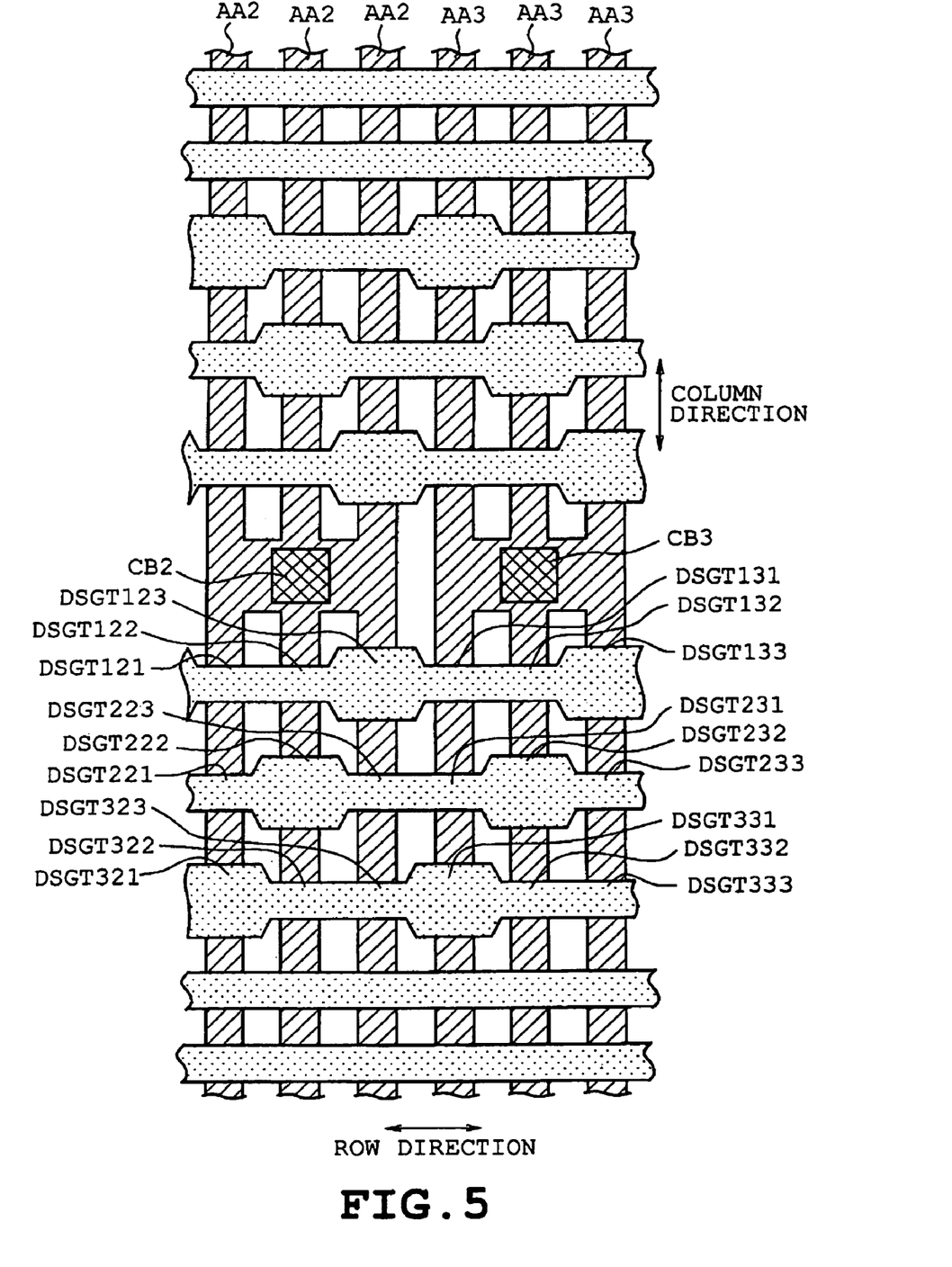
FIG. 5 is a view similar to FIG. 1, showing another embodiment of the invention.

The invention should be limited to the foregoing embodiments. The embodiments may be modified or expanded as follows. Two columns of strings AL21 and AL22 are formed so as to correspond to the bit line BL2 in the foregoing embodiments. However, for example, three or more columns of NAND strings may be formed so as to correspond to the bit line BL2. In the latter case, as shown in FIG. 5, it is desirable to form the selective gate transistors DSGT121, DSGT221, DSGT321, DSGT122, DSGT222, DSGT322, DSGT123, DSGT 223 and DSGT323 so that one of the selective gate transistors has a different gate length from the other selective gate transistors in the row direction and so that one of the selective gate transistors has a different gate length from the other selective gate transistors in the column direction. Consequently, substantially the same effect can be achieved from the above modification as from the foregoing embodiments. Additionally, the forming region of the bit line contact CB2 can be rendered wider. In other words, even when high integration and refinement of a memory cell further progress, the bit line contact CB2 can easily be formed.

Furthermore, it is desirable that each of the selective gate transistors DSGT321, DSGT222 and DSGT123 which has the different gate length in the row and column directions is formed into the enhancement mode transistor and that each of the other selective gate transistors are formed into the depletion mode transistors.

The selective gate transistors are formed into the depletion and enhancement mode MOS transistors in the first and second embodiments. However, the selective gate transistors may be formed into either type if the transistors have different gate lengths.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A non-volatile semiconductor memory device comprising:
   a plurality of bit lines;
   a bit line contact provided so as to correspond to the bit lines;
   a first NAND string and a second NAND string both connected to a common bit line via the bit line contact;

a first string selective transistor and a second string selective transistor both connected in series to the first NAND string between the first NAND string and the bit line contact; and a third string selective transistor and a fourth string selective transistor both connected in series to the second NAND string between the second NAND string and the bit line contact, wherein the first and third string selective transistors are connected to each other, whereas the second and fourth string selective transistors are connected to each other, and each of the first and fourth string selective transistors has a first gate length and each of the second and third string selective transistors has a second gate length differing from the first gate length.

2. The non-volatile semiconductor memory device according to claim 1, wherein each of the second and third string selective transistors comprises an enhancement mode transistor and each of the first and fourth string selective transistors comprises a depletion mode transistor.

3. A semiconductor device provided with NAND strings and select gates having different gate lengths, comprising:

a first bit line and a second bit line;

a first bit line contact provided so as to correspond to the first bit line;

a second bit line contact provided so as to correspond to the second bit line;

a first NAND string and a second NAND string both connected via the first bit line contact to the first bit line;

a third NAND string and a fourth NAND string both connected via the second bit line contact to the second bit line;

a first string selective transistor and a second string selective transistor both connected in series to the first NAND string between the first bit line contact and the first NAND string;

a third string selective transistor and a fourth string selective transistor both connected in series to the second NAND string between the first bit line contact and the second NAND string;

a fifth string selective transistor and a sixth string selective transistor both connected in series to the third NAND string between the second bit line contact and the third NAND string; and a seventh string selective transistor and an eighth string selective transistor both connected in series to the fourth NAND string between the second bit line contact and the fourth NAND string, wherein:

the first, third, fifth and seventh string selective transistors are connected to one another;

the second, fourth, sixth and eighth string selective transistors are connected to one another;

each of the first, fourth, sixth and seventh string selective transistors has a first gate length; and each of the second, third, fifth and eighth string selective transistors have the same second gate length differing from the first gate length.

4. The semiconductor device according to claim 3, wherein each of the second, third, fifth and eighth string selective transistors comprises an enhancement mode transistor and each of the first, fourth, sixth and seventh string selective transistors comprises a depletion mode transistor.

5. A semiconductor device provided with NAND strings and select gates having different gate lengths, comprising:

a first bit line and a second bit line;

a first bit line contact provided so as to correspond to the first bit line;

a second bit line contact provided so as to correspond to the second bit line;

a first NAND string, a second NAND string and a third NAND string all connected via the first bit line contact to the first bit line;

a fourth NAND string, a fifth NAND string and a sixth NAND string all connected via the second bit line contact to the second bit line;

a first string selective transistor, a second string selective transistor and a third string selective transistor all connected in series to the first NAND string between the first bit line contact and the first NAND string;

a fourth string selective transistor, a fifth string selective transistor and a sixth string selective transistor all connected in series to the second NAND string between the first bit line contact and the second NAND string;

a seventh string selective transistor, an eighth string selective transistor and a ninth string selective transistor all connected in series to the third NAND string between the first bit line contact and the third NAND string;

a tenth string selective transistor, an eleventh string selective transistor and a twelfth string selective transistor all connected in series to the fourth NAND string between the second bit line contact and the fourth NAND string;

a thirteenth string selective transistor, a fourteenth string selective transistor and a fifteenth string selective transistor all connected in series to the fifth NAND string between the second bit line contact and the fifth NAND string;

a sixteenth string selective transistor, a seventeenth string selective transistor and an eighteenth string selective transistor all connected in series to the sixth NAND string between the second bit line contact and the sixth NAND string, wherein:

the first, fourth, seventh, tenth, thirteenth and sixteenth string selective transistors are connected to one another;

the second, fifth, eighth, eleventh, fourteenth and seventeenth string selective transistors are connected to one another;

the third, sixth, ninth, twelfth, fifteenth and eighteenth string selective transistors are connected to one another;

each of the first, second, fourth, sixth, eighth, ninth, tenth, eleventh, thirteenth, fifteenth, seventeenth and eighteenth string selective transistors has a first gate length; and each of the third, fifth, seventh, twelfth, fourteenth and sixteenth string selective transistors has a second gate length differing from the first gate length.

6. The semiconductor device according to claim 5, wherein each of the third, fifth, seventh, twelfth, fourteenth and sixteenth string selective transistors comprises an enhancement mode transistor and each of the first, second, fourth, sixth, eighth, ninth, tenth, eleventh, thirteenth, fifteenth, seventeenth and eighteenth string selective transistors comprises a depletion mode transistor.

* * * * *